United States Patent [19]
Kusunose

[11] Patent Number: 5,275,895
[45] Date of Patent: Jan. 4, 1994

[54] METHOD OF MANUFACTURING PHASE-SHIFTING MASK

[75] Inventor: Haruhiko Kusunose, Itami, Japan

[73] Assignee: Mitsubishi Denki Kabushiki Kaisha, Tokyo, Japan

[21] Appl. No.: 877,946

[22] Filed: Apr. 28, 1992

[30] Foreign Application Priority Data

Jun. 18, 1991 [JP] Japan .................... 3-145152

[51] Int. Cl.$^5$ ................................ G03F 9/00
[52] U.S. Cl. .......................... 430/5; 430/324
[58] Field of Search ..................... 430/5, 324

[56] References Cited

U.S. PATENT DOCUMENTS

| | | | |
|---|---|---|---|
| 4,738,907 | 4/1988 | Shigetomi et al. | 430/5 |
| 4,876,164 | 10/1989 | Watakabe et al. | 430/5 |
| 4,895,779 | 1/1990 | Yoshioka et al. | 430/5 |
| 5,045,417 | 9/1991 | Okamoto | 430/5 |
| 5,085,957 | 2/1992 | Hosono | 430/5 |
| 5,153,083 | 10/1992 | Garofalo et al. | 430/5 |

FOREIGN PATENT DOCUMENTS 58-17344 10/1983 Japan .
62-67514 3/1987 Japan .
62-67547 3/1987 Japan .

*Primary Examiner*—Marion E. McCamish
*Assistant Examiner*—Mark A. Chapman
*Attorney, Agent, or Firm*—Oblon, Spivak, McClelland, Maier & Neustadt

[57] ABSTRACT

A light-shielding pattern including light-shielding regions and an aperture therebetween is formed on a substrate. The substrate and the light-shielding pattern are then coated with conductive film. The conductive film is thereafter patterned, defining a conductive pattern. Next, a phase-shifting film and a resist film are deposited in this order on the substrate, the light-shielding pattern and the conductive pattern. Following this, a light beam is illuminated toward the bottom surface of the substrate and developed, thereby defining a resist pattern. The phase-shifting film is thereafter selectively etched with the resist pattern as an etching mask. As a result, a phase-shifter is obtained. Thus, the conductive pattern not only acts as an etching stopper but also prevents the substrate from getting charged. Hence, a phase-shifting mask is manufactured accurately.

19 Claims, 30 Drawing Sheets

LIGHT INTENSITY

ELECTRIC FIELD

LIGHT INTENSITY

LIGHT
INTENSITY

METHOD OF MANUFACTURING PHASE-SHIFTING MASK

BACKGROUND OF THE INVENTION

1. Field of the Invention

The present invention relates to a method of manufacturing a phase-shifting mask used in fabricating an LSI device. It particularly relates to a method of forming a phase-shifted pattern with high accuracy.

2. Description of the Background Art

When a reduction type stepper is used in photolithography, a resolution limit R is:

$$R = K1\lambda/NA$$

where $K1$ is a constant dependent on a type of a resist, $\lambda$ is a wavelength of an exposure light beam and $NA$ is a numerical aperture of a lens. The lower limit of the constant $K1$ is around 0.5.

The resolution limit R is lowered, in other words, resolution is enhanced, by decreasing the constant $K1$ and using smaller wavelength $\lambda$ while increasing the numerical aperture $NA$. It is known that, $NA$ can be reduced to around 0.5. Hence, where $NA$ is around 0.5 and the i-beam ($\lambda = 365$ nm) is used, the resolution limit R as low as around 0.4 micron is possible.

To further lower the resolution limit R, either much shorter wavelength $\lambda$ or much larger $NA$ is necessary. However, both a light source producing such a short wavelength and a lens having such a large $NA$ should require extremely difficult structure. Rather, a much shorter wavelength $\lambda$ and much larger $NA$ have adverse affect. When the wavelength $\lambda$ is further decreased or when $NA$ is further increased, a depth of focus $\delta$ is reduced, damaging the resolution, since the depth of focus $\delta$, the wavelength $\lambda$ and $NA$ are in the following relation:

$$\delta = \lambda/[2(NA)2]$$

Various methods have been proposed to solve the problems. One such effort is phase-shifting lithography exposure as disclosed in Japanese Laid-Open Gazette Nos. 57-62052 and 58-173744. Advantages of phase-shifting lithography over lithography using an ordinary photomask will be described below.

FIGS. 1A–1C are diagrams showing principles of lithography using an ordinary photomask. The ordinary photomask comprises a transparent glass substrate 1 with an opaque light-shielding pattern 2 formed thereon. The light-shielding pattern 2 consists of light-shielding regions and apertures 2a (FIG. 1A). In the case of molybdenum silicide, however, any other material may be used which blocks exposure light beams used in lithography such as the g-beam, the i-beam and excimer laser beams.

When a light beam is transmitted through the ordinary photomask, light intensity at a wafer is largely affected by interference as shown by the intensity waveform of FIG. 1C. At the plane immediately below the photomask, electric field is zero in magnitude except at the apertures 2a and is otherwise constant (FIG. 1B). However, at the wafer, which is a certain distance away from the photomask, the intensity does not remain zero at the same regions, that is, regions corresponding to the light-shielding regions 2a (non-transparent regions) since light beams diffracted from the adjacent apertures overlap and intensify each other. Hence, the pattern 2 cannot be resolved.

FIGS. 2A–2C are diagrams showing principles of phase-shifting lithography. A phase-shifting mask of FIG. 2A is obtainable from adding a phase-shifter 3 made of transparent material such as $SiO_2$ to the ordinary photomask in such a manner that the phase-shifter 3 covers all other apertures. In this phase-shifting mask, a light beam transmitted by the phase-shifter 3 is 180 degrees out of phase with an incident light beam. The phase-shifting mask is otherwise identical to the ordinary photomask.

Assume that a light beam is transmitted through the phase-shifting mask. At the plane immediately below the mask, the electric field passing through the covered apertures has a sign opposite to that of the electric field passing through the uncoated apertures (FIG. 2B). Therefore, when the pattern 2 is projected onto a wafer by the same projection optical system used in the ordinary lithography, light beams diffracted from the adjacent apertures cancel out each other at the wafer at the non-transparent regions. As a result, at the regions where cancellation occurs, intensity becomes practically zero, whereby the pattern 2 is transferred onto the wafer with high resolution. According to experimental results, a minimum width of a pattern resolved by using the phase-shifting mask of FIG. 2A is about half that of a pattern resolved by using the ordinary photomask of FIG. 1A.

The phase-shifting mask of FIG. 2A, however, is insufficient. Although excellent for periodic line-and-space pattern implementation, the phase-shifting mask is not applicable, if not at all, to where the pattern 2 is an optional pattern. Against this backdrop, improved phase-shifting masks have been proposed. For example, the mask described in the article "NEW PHASE SHIFTINGMASK WITH SELF-ALIGNED PHASE SHIFTERS FOR A QUARTER MICRON PHOTOLITHOGRAPHY," A. Nitayama et al., IEDM Conference, 1989.

The improved phase-shifting mask disclosed in the article is obtained by adding to the ordinary photomask of FIG. 1A a phase-shifter 3 which is a little wider than the light-shielding pattern 2 such that the phase-shifter 3 is formed on the light-shielding pattern 2 (FIG. 3A).

The phase-shifter 3 is formed from a resist pattern which functions as an etching mask when the light-shielding pattern 2 is etched. Specific manufacturing process of the phase-shifter 3 is as follows: First, a light-shielding film is deposited on a glass substrate 1. Next, a resist pattern, i.e., the phase-shifter 3 is formed on the light-shielding film. The light-shielding film is then patterned by anisotropic etching such as plasma etching with the phase-shifter 3 as a mask, thereby obtaining the light-shielding pattern 2. Furthermore, edge portions of the thus obtained light-shielding pattern 2 are removed a little bit by isotropic etching such as wet etching. As a result, the light-shielding pattern 2 which is a little narrower than the phase-shifter 3 is formed (FIG. 3A).

When a light beam is transmitted by the phase-shifter 3, light intensity at a non-transparent region disappears at a wafer (FIG. 3B). Hence, the light-shielding pattern 2 is resolved with high accuracy, printing a very sharp pattern on the wafer. In addition, since the phase-shifter 3 is formed easily in a self-aligned manner, this improved phase-shifting approach promises accurate pattern transfer even when the light-shielding pattern 2 has a non-periodic feature.

Recent efforts have resulted in further improvement in the phase-shifting approach as above. One such effort is phase-shifting in which a phase-shifting mask produces a null or a sharp drop in intensity at an edge of the phase-shifter 3. This approach is disclosed, for example, in the article "0.2 μm OR LESS i-LINE LITHOGRAPHY BY PHASE-SHIFTING-MASK TECHNOLOGY," H. Jinbo et al., IEDM Conference, 1990. According to the disclosed phase-shifting technology, the phase-shifter 3 is formed directly on the glass substrate 1. A light beam transmitted at an edge portion 3b of the phase-shifter 3 is therefore 180 degrees out of phase with an incident light beam (FIG. 4B), whereby light intensity at the edge portion 3b partially drops to zero at the wafer (FIG. 4C). Hence, a fine resist pattern is printed. The article reports that a 0.15-micron wide isolated space is resolvable by exposing a negative resist using the phase-shifting mask of FIG. 4A.

Still further improvement has been disclosed by the article "A New Phase Shifting Mask Structure for Positive Resist Process," J. Miyazaki et al., Proceeding of SPIE's 1991 Symposium on Microlithography. The article introduces a phase-shifting mask which is obtainable by modifying the phase-shifting mask of FIG. 4A such that the thickness of the edge portion 3b is thinner around one end than around the other end (FIG. 5A). In the modified phase-shifting mask, a light beam transmitted at the edge portion 3b in the thinner side arrives at a wafer about 90 degrees out of phase with a light beam through an unmasked region while light beams at the other portions arrive about 180 degrees out of phase. Thus, the light intensity at the end portion 3b is almost the same as that at the unmasked region although the null or the sharp drop in intensity at the other end portions occurs (FIG. 5B).

Now, manufacturing process of the phase-shifting mask of FIG. 2A will be described to show where inconvenience lies in the phase-shifting masks heretofore described. First, a light-shielding film made of molybdenum silicide is formed on the glass substrate 1. The light-shielding film is then patterned by electric-beam lithography (EB lithography) to define the light-shielding pattern 2. Next, an $SiO_2$ film is deposited on the substrate-pattern combination. The $SiO_2$ film is then patterned by EB lithography, thereby the phase-shifter 3 being formed. Thus, the phase-shifting mask of FIG. 2A is obtained.

The phase-shifting mask of FIG. 4A is obtainable by the same manufacturing process as above only if the second EB lithography patterns the $SiO_2$ film in such a manner that the $SiO_2$ film remains partially unetched on the glass substrate 1 in order to form the edge portion 3b.

The phase-shifting mask of FIG. 5A is obtainable by further modification; still more EB lithography reduces the thickness of the edge portion 3b of the phase-shifger 3.

All of the manufacturing processes require EB lithography at least twice. The second EB lithography is particularly laborious because the phase-shifter 3, which will be defined by the second EB lithography, must be aligned with extremely high accuracy to the light-shielding pattern 2, which has been already defined by the first EB lithography. Despite such requirement, since relative positional accuracy between the phase-shifter 3 and the light-shielding pattern 2 is dependent on the drawing accuracy of an E-beam, it is impossible to improve the positional accuracy beyond what the drawing accuracy enables.

The substrate 1 is made of the same material as the phase-shifter 3. When etching time is over an optimum period, not only the $SiO_2$ film (phase-shifter) but also the substrate 1 is etched. In reactive ion etching (RIE), furthermore, the glass substrate 1 becomes charged, and the etching accuracy is degraded.

Another problem encountered during the manufacturing processes of the phase-shifting masks is deviation of E-beam due to electrification of the glass substrate 1. The glass substrate 1 is insulative, and hence, is charged when illuminated with E-beam. As a result, the E-beam would deviate and hit the phase-shifting mask at a wrong location, which means that pattern definition becomes different from what is desired.

SUMMARY OF THE INVENTION

In a first aspect, the present invention relates to a method of manufacturing a phase-shifting photomask comprising a transparent substrate, a light-shielding pattern and a phase-shifter, the transparent substrate having one major surface and other major surface, the light-shielding pattern and the phase-shifter being provided on the one major surface of the transparent substrate. The method of the first aspect comprises the steps of: (a) preparing the transparent substrate; (b) forming said light-shielding pattern on the major surface of the transparent substrate; (c) covering the one major surface of the transparent substrate and the light-shielding pattern with a conductive film made of metal or silicide metal; (d) removing the conductive film at a selected portion in which the phase-shifter is to be formed thereby defining a conductive pattern; (e) depositing a phase-shifting film on the transparent substrate, the light-shielding pattern and the conductive pattern; (f) selectively etching and removing the phase-shifting film except at the selected portion thereby the phase-shifter being obtained; and (g) removing the conductive pattern.

Preferably, the step (d) essentially consists of the steps of: (d-1) coating the conductive film with a resist film; (d-2) exposing the resist film at a selected portion by electron-beam irradiation; (d-3) developing the resist film and etching the selected portion of the resist film thereby forming a resist pattern; and (d-4) selectively etching the conductive film with the resist pattern as an etching mask.

Preferably, the conductive film is grounded during the E-beam irradiation of the resist region.

Preferably, the conductive film is chromium.

Preferably, the conductive film is selectively etched by reactive ion etching using CC14 as etching gas.

In another aspect, the method further comprises the steps of: (h) depositing a resist film on the light-shielding pattern, the phase-shifter and the conductive pattern; (i) etching the resist film at a selected portion over one end portion of the phase-shifter and a portion of the conductive pattern adjacent to the one end portion and defining a resist pattern; and (j) thinning the one end portion of the phase-shifter to a predetermined thickness by etching using the resist pattern as an etching mask.

In another aspect, the step (h) preferably essentially consists of the steps of: (h-1) exposing the selected portion of the resist film by E-beam irradiation; and (h-2) developing the resist film and etching the selected portion thereof.

Preferably, the conductive pattern is grounded during the E-beam irradiation of the selected portion of the resist film.

Preferably, the phase-shifter is made of SiO$_2$.

Preferably, the phase-shifter is selectively etched by reactive ion etching using CHF3 as etching gas.

Preferably, a pattern defect inspection step is carried out before the step (e) to inspect a pattern defect in the conductive pattern if any.

Preferably, the method further comprises the step of repairing the pattern defect in the conductive pattern inspected in the pattern defect inspection step.

In a second aspect, the present invention relates to a method of manufacturing a phase-shifting photomask comprising a transparent substrate, a first light-shielding pattern and a phase-shifter, the transparent substrate having one major surface and other major surface, the first light-shielding pattern and the phase-shifter abutting each other on the one major surface of the transparent substrate. The method of the second aspect comprising the steps of: (a) preparing the transparent substrate; (b) forming a second light-shielding pattern which includes said first light-shielding pattern on the one major surface of the transparent substrate, the second light-shielding pattern comprising non-transparent regions and an aperture between the non-transparent regions; (c) depositing a phase-shifting film on the transparent substrate and the second light-shielding pattern; (d) coating the phase-shifting film with resist film; (e) irradiating a light beam toward the other major surface of the transparent substrate and exposing the resist film at a selected portion; (f) developing the resist film thereby obtaining a resist pattern which correspond to the selected portion of the resist film; (g) selectively etching the phase-shifting film with the resist pattern as an etching mask to obtain the phase-shifter; and (h) removing the at least one of the non-transparent regions thereby obtaining the first light-shielding pattern.

Preferably, the phase-shifter is made of SiO$_2$.

Preferably, the phase-shifting material is selectively etched by reactive ion etching using CHF3 as etching gas.

Preferably, the step (h) essentially includes the steps of: (h-1) forming a resist film over the transparent substrate, the phase-shifter and the second light-shielding pattern; (h-2) exposing with E-beam the resist film at a predetermined portion which includes at least one of the non-transparent regions which must be removed; (h-3) developing the resist film and etching the predetermined portion of the resist film thereby defining a resist pattern; and (h-4) removing the at least one of the non-transparent regions which must be removed by etching using the resist pattern as an etching mask.

Preferably, the non-transparent regions are made of molybdenum silicide.

Preferably, the at least one of the non-transparent regions is removed by reactive ion etching using CF4 as etching gas.

In a third aspect, the present invention relates to a method of manufacturing a phase-shifting mask, comprising the steps of: (a) preparing a transparent substrate having one major surface and other major surface; (b) forming a light-shielding pattern on the one major surface of the transparent substrate, the light-shielding pattern including non-transparent regions and a predetermined aperture between the non-transparent regions; (c) forming a conductive film made of metal or silicide metal on the transparent substrate and the light-shielding pattern; (d) patterning the conductive film at a portion corresponding to the aperture by E-beam lithography removal thereby defining a conductive pattern; (e) depositing a phase-shifting film on the transparent substrate, the light-shielding pattern and the conductive pattern; (f) coating the phase-shifting film with a resist film; (g) irradiating a light beam toward the other major surface of the transparent substrate and exposing the resist film at portion corresponding to the aperture; (h) developing the resist film and obtaining a resist pattern corresponding to the aperture; and (i) selectively etching the phase-shifting film with the resist pattern as an etching mask thereby forming a phase-shifter.

Accordingly, a first object of the present invention is to obtain a method of manufacturing a phase-shifting mask with improved accuracy by preventing electrification of a transparent substrate during formation of a phase-shifter.

A second object of the present invention is to obtain a method of manufacturing a phase-shifting mask with improved accuracy by forming a phase-shifter with an improved positional accuracy relative to a light-shielding pattern.

These and other objects, features, aspects and advantages of the present invention will become more apparent from the following detailed description of the present invention when taken in conjuction with the accompanying drawings.

DESCRIPTION OF THE PREFERRED EMBODIMENT

A method of manufacturing a phase-shifting mask according to a first preferred embodiment of the present invention will be described while referring to FIGS. 6-17.

Figure 6:
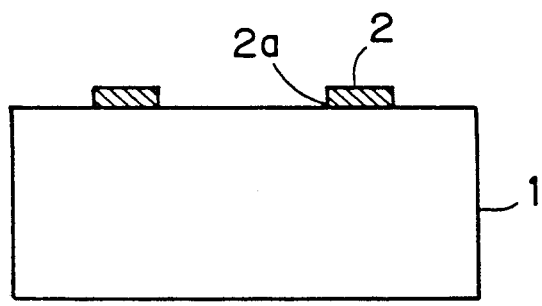
FIGS. 6-17 are diagrams showing a manufacturing method of a phase-shifting mask according to a first embodiment of the present invention.

First, a molybdenum silicide film is formed on a glass substrate 1 and then patterned by EB lithography to define a light-shielding pattern 2 (FIG. 6). The patterning in the EB lithography is performed by RIE using CF4 as reactive etching gas, defining a light-shielding pattern 2 made of molybdenum silicide (FIG. 6).

Figure 7:
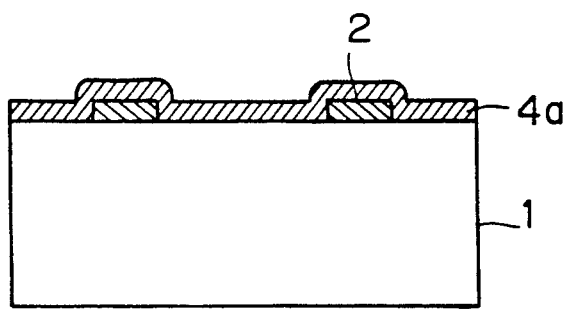
Figure 8:
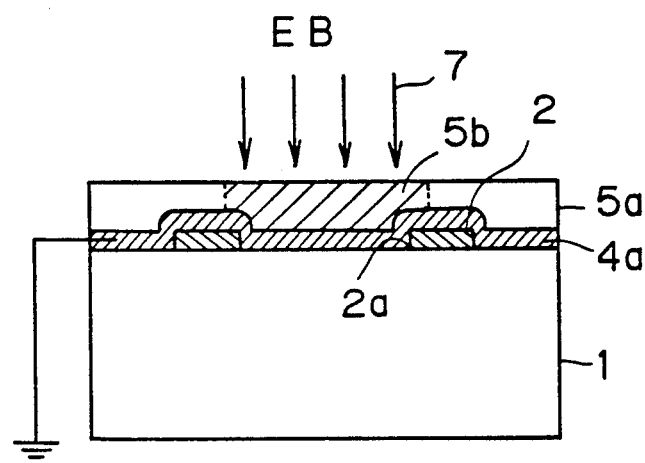

Next, a conductive film, i.e., a chromium film 4a is deposited on the substrate-pattern combination of FIG. 6 by sputtering or E-beam deposition (FIG. 7). The top surface of the chromium film 4a is then coated with a positive resist film 5a sensitive to E-beam using a spin coater (FIG. 8). The resist film 5a is thereafter selectively exposed with an E-beam 7 to form an exposed resist region 5b which corresponds to an aperture 2a of the light-shielding pattern 2. Although subjected to E-beam radiation, the substrate 1 would not be electrified since the chromium film 4a coating the substrate 1 is grounded. Hence, precise E-beam drawing as intended is attained.

Figure 9:
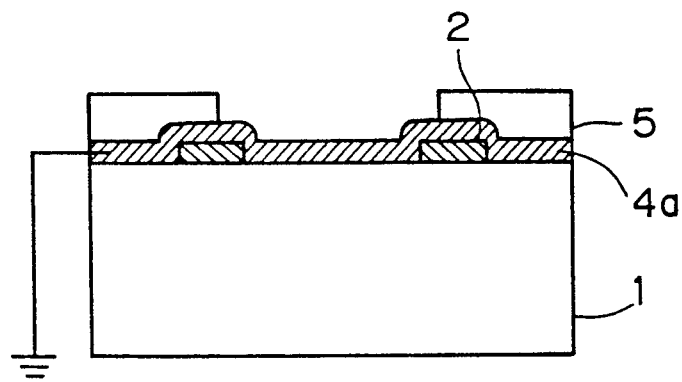
Figure 10:
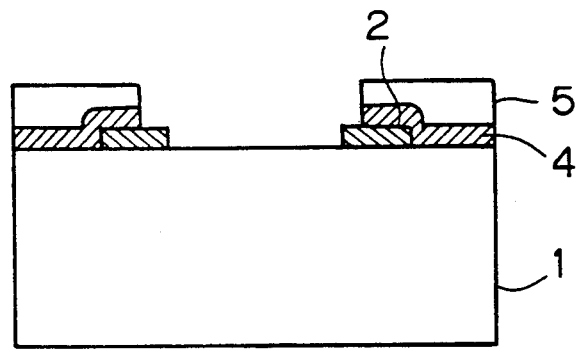

The resist region 5b, now exposed with the E-beam exposure, is dissolved by $O_2$ plasma etching, leaving a resist pattern 5 (FIG. 9). The chromium film 4a is then selectively etched away by RIE using $CCl_4$ as etching gas, during which the chromium film 4a remains grounded to avoid electrification, thereby obtaining a chromium pattern 4 (FIG. 10). By removing the resist pattern 5 (FIG. 11), formation of the chromium pattern 4 by EB lithography completed.

Pattern defects such as pinholes are inspected and preferably repaired using a commercially available pattern defect inspection system (not shown), before proceeding to a next step. More precisely, pattern defects are inspected through observation of a transmitted light beam from the photomask of FIG. 11. When a pattern includes a pinhole or a notch, metal or carbon may be deposited to fill the defects. A defect in the form of a protrude is removed by laser beam or focused ion beam irradiation. Thus, an improved yield is ensured in the phase-shifting mask manufacturing.

Figure 11:
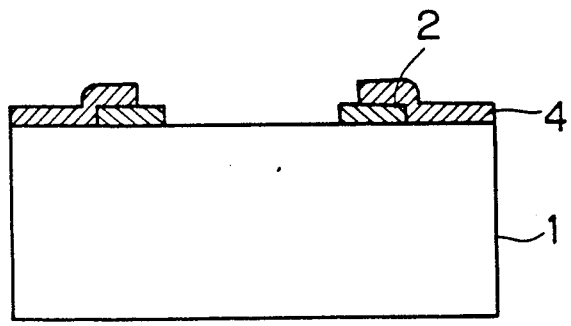
Figure 12:
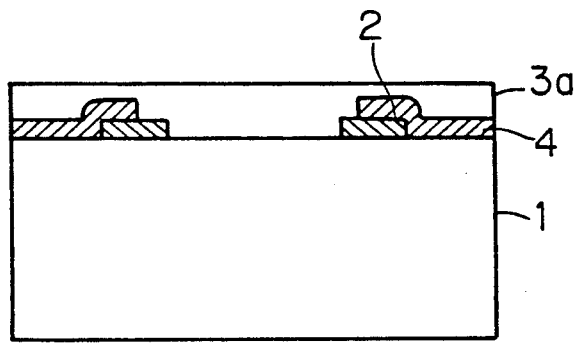
Figure 13:
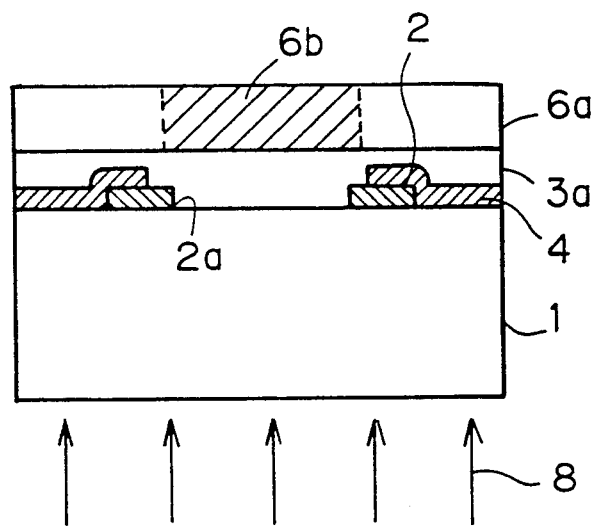

Following the formation of the chromium pattern 4, an $SiO_2$ film 3a is deposited by chemical vapor deposition (CVD) on the unfinished phase-shifting mask of FIG. 11 which consists of the substrate 1, the chromium pattern 4 and the light-shielding pattern 2 (FIG. 12). The $SiO_2$ film 3a is then covered with a UV-light sensitive negative resist film 6a by spin coating and illuminated with a UV light beam 8 from the bottom surface side of the substrate 1. The UV light illumination requires the illumination dose to exceed an optimum dose in ordinary contact printing by around 10%. Consequently, an exposed resist region 6b approximately corresponds to but is a little wider than the aperture 2a is formed.

Figure 14:
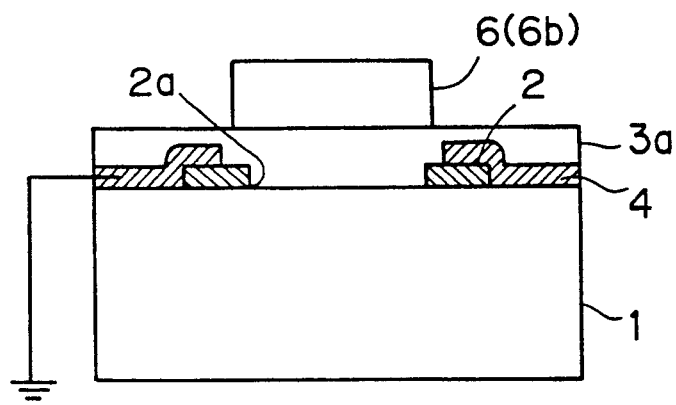

Thereafter, the resist film 6a is dissolved in developer to leave a resist pattern 6 (FIG. 14). The resulting resist pattern 6, thus formed in a self-aligned manner, is accurately aligned to the aperture 2a.

Figure 15:
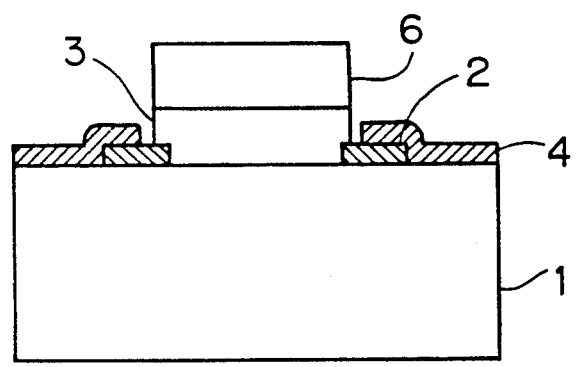
Figure 16:
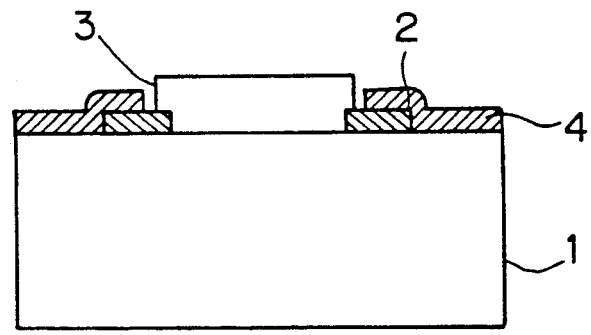

The $SiO_2$ film 3a is selectively etched by RIE using $CHF_3$ as etching gas and the resist pattern 6 as an etching mask to define a phase-shifter 3 (FIG. 15). Like the resist pattern 6, the phase-shifter 3 is self-aligned. Hence, accurate alignment between the phase-shifter 3 and the light-shielding pattern 2 is ensured. Another advantage is that the substrate 1 is prevented from being etched away. Even when etching time is relatively long, etching automatically stops upon hitting the chromium pattern 4 or the light-shielding pattern 2 both situated under the $SiO_2$ film 3a in the portions to be removed. Thus, the chromium pattern 4 behaves as an etching stopper, preventing etching of the substrate 1 in an effective and easy manner. Still another advantage is that the substrate 1 is prevented from getting electrified while etched because the chromium pattern 4 is grounded as shown in FIG. 14. Hence, detarioration of etching accuracy is effectively prevented.

Figure 17:
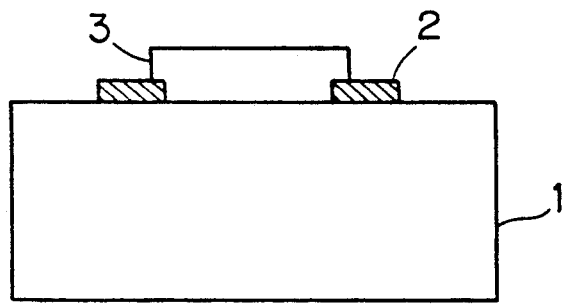

Next, the resist pattern 6 is removed by $O_2$ plasma ashing (FIG. 16), followed by the chromium pattern 4 being etched by RIE using $CCl_4$ as etching gas (FIG. 17). Thus, the manufacturing method of the phase-shifting mask of the first preferred embodiment is completed.

A method of manufacturing a phase-shifting mask according to a second preferred embodiment of the present invention will be now described while referring to FIGS. 18-27.

Figure 18:
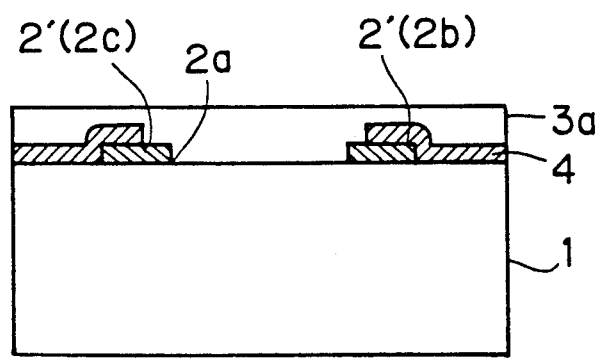
FIGS. 18-27 are diagrams showing a manufacturing method of a phase-shifting mask according to a second embodiment of the present invention.
Figure 19:
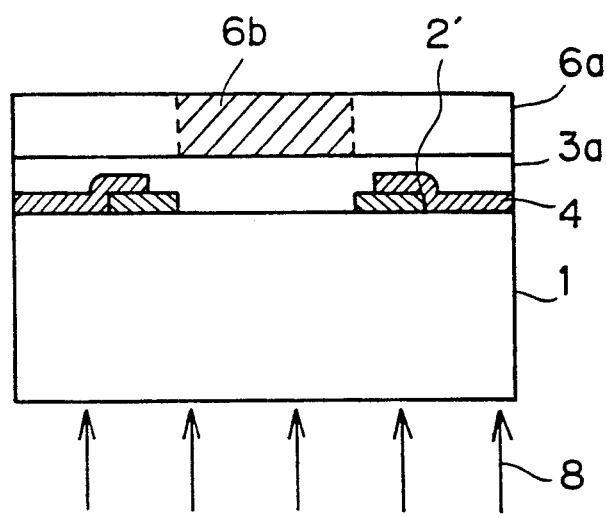

First, a light-shielding pattern 2' is deposited on a substrate 1, similarly to the first step of the manufacturing method of the first preferred embodiment. The light-shielding pattern 2' includes non-transparent regions 2b and 2c and an aperture 2a defined by the non-transparent regions 2b and 2c (FIG. 18). The second preferred embodiment differs from the first preferred embodiment in that the non-transparent region 2b is ultimately removed to define a desired light-shielding pattern 2.

Next, a chromium pattern 4 and an $SiO_2$ film 3a are formed in this order on the substrate-pattern combination (FIG. 18). The $SiO_2$ film 3a is then spin coated with a UV-light sensitive negative resist film 6a. The resist film 6a is thereafter illuminated with a UV light beam 8 striking the substrate 1 from the bottom surface. Differently from the first preferred embodiment, the dose of the illumination light is optimum. Hence, the resist film 6a is exposed at a resist region 6b which is above and the same as the aperture 2a in dimension.

Figure 20:
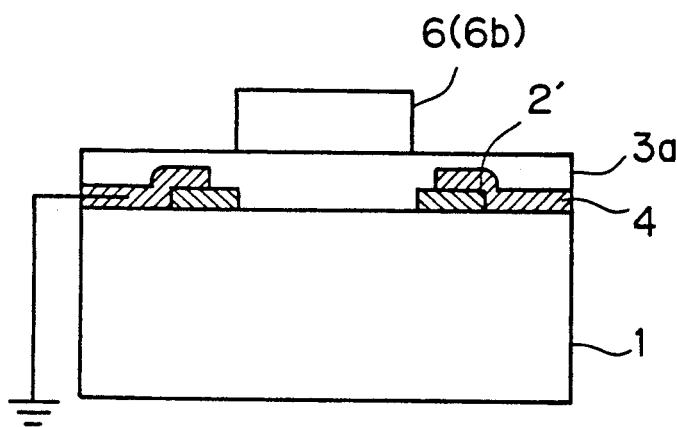
Figure 21:
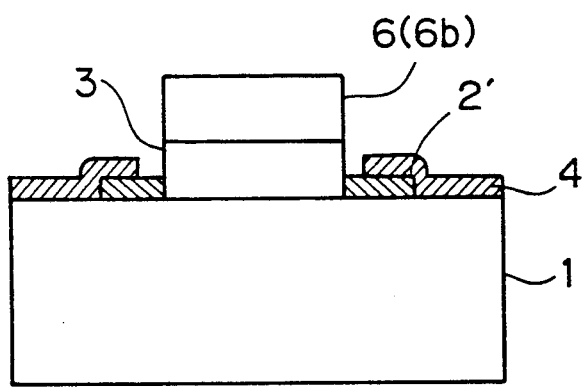
Figure 22:
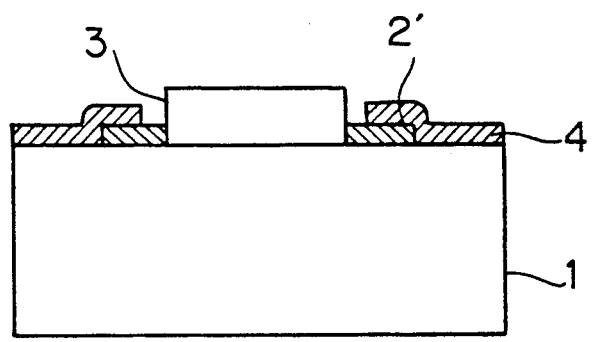
Figure 23:
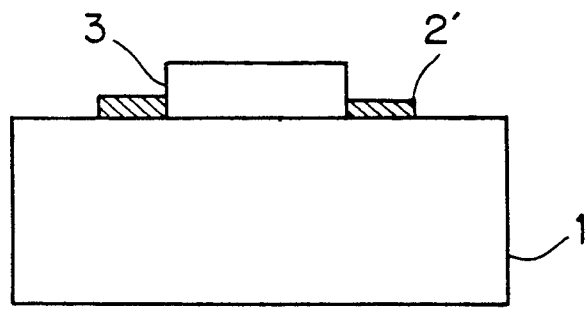

The resist film 6a is then developed, whereby a resist pattern 6 is defined which is dimensionally identical to the aperture 2a (FIG. 20). The remaining manufacturing steps are almost similar to the corresponding steps of the first preferred embodiment (FIGS. 21-23). That is, the $SiO_2$ film 3a is selectively etched by RIE using the resist pattern 6 as an etching mask, thereby a phase-shifter 3 being defined (FIG. 21). The resist pattern 6 is then removed by $O_2$ plasma ashing (FIG. 22), and the chromium pattern 4 is etched by RIE (FIG. 23).

Figure 24:
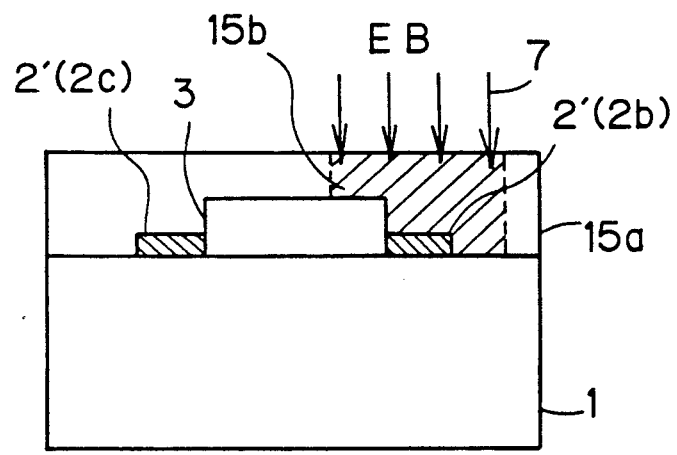

To obtain the phase-shifting pattern of FIG. 4A, the second preferred embodiment includes additional process steps as described in the following (FIGS. 24-27). A positive resist film 15 which is sensitive to E-beam covers the phase-shifting mask of FIG. 23 (FIG. 24). The resist film 15 is then selectively illuminated with an E-beam 7 at a resist region 15b which is a little wider than the light-shielding pattern 2b.

Figure 25:
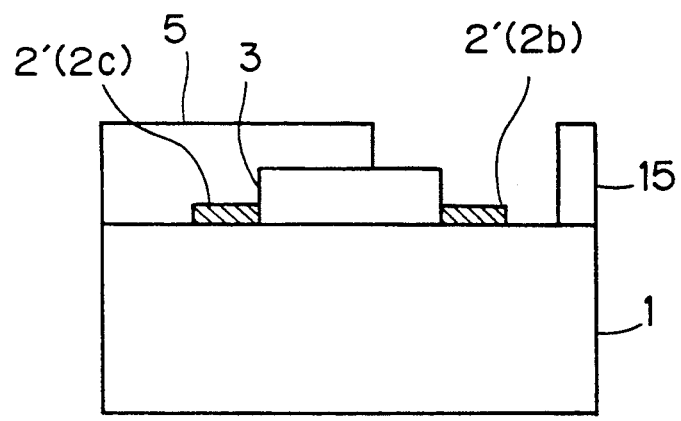
Figure 26:
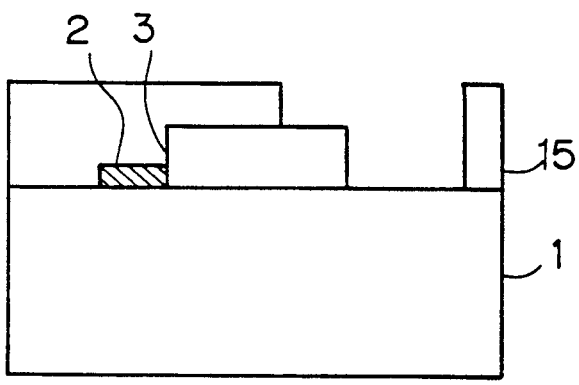
Figure 27:
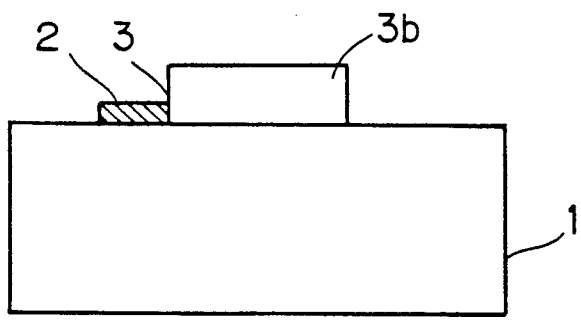
Figure 28:
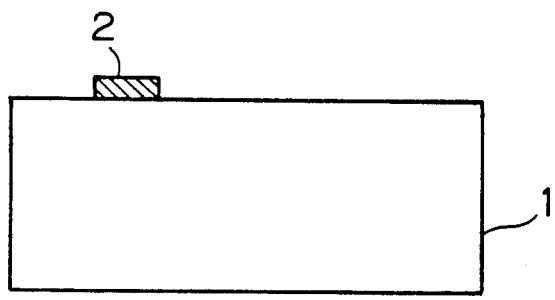
FIGS. 28-39 are diagrams showing a manufacturing method of a phase-shifting mask according to a third embodiment of the present invention.

Next, the resist region 15b is removed by $O_2$ plasma etching to define a resist pattern 15 (FIG. 25). The light-shielding pattern 2b is thereafter etched by RIE using the resist pattern 15 as an etching mask and $CF_4$ as etching gas, thereby obtaining a desired light-shielding pattern 2 (FIG. 26). As a final step, the resist pattern 15 is removed (FIG. 27).

Thus, in addition to the effects provided in the first preferred embodiment, the second preferred embodiment creates an effect that a light intensity pattern at the edge portion 3b of the phase-shifter 3 prints as a fine feature on a wafer.

A method of manufacturing a phase-shifting mask according to a third preferred embodiment of the present invention will now be described. The accompanying drawings are FIGS. 28-39.

Figure 29:
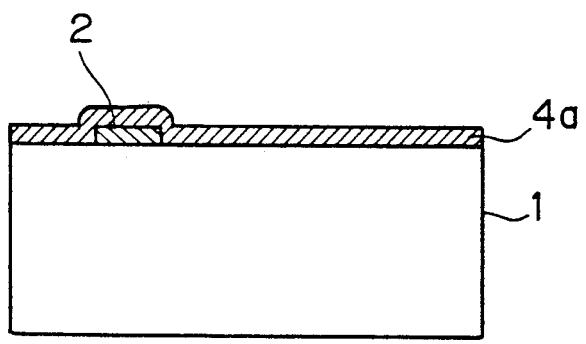
Figure 30:
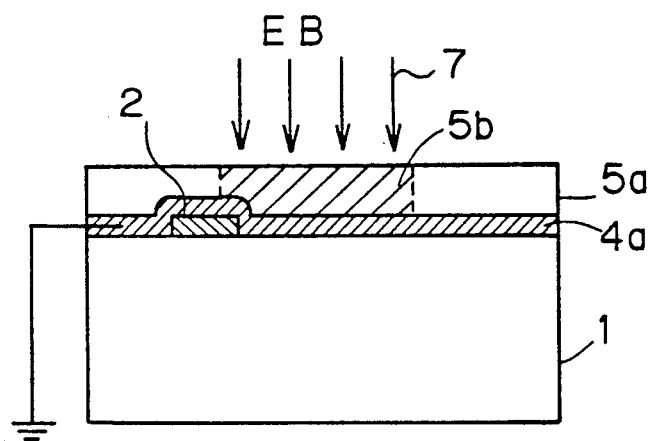
Figure 31:
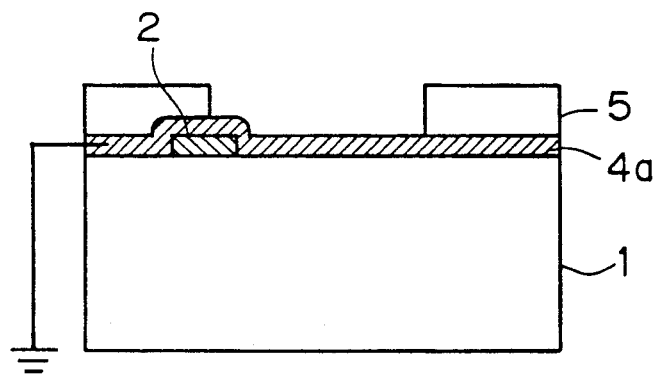
Figure 32:
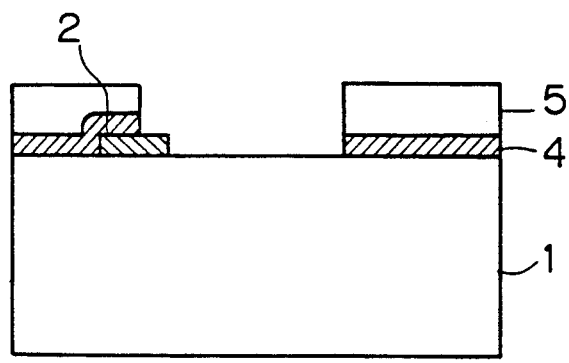

First, a light-shielding pattern 2 of molybdenum silicide is formed on a glass substrate 1 (FIG. 28), similarly to the first preferred embodiment. Next, a chromium film 4a is deposited on the substrate 1 and the light-shielding pattern 2 by sputtering or E-beam deposition (FIG. 29). The top surface of the chromium film 4a is then coated with a positive resist film 5a which is sensitive to E-beam using a spin coater (FIG. 30). The resist film 5a is thereafter irradiated with an E-beam 7 and exposed at a resist region 5b in which a phase-shifter is to be formed later. The chromium film 4a is grounded during the EB lithography.

The resist film 5a is then selectively removed at the resist region 5b by $O_2$ plasma etching, defining a resist pattern 5 (FIG. 31), followed by that the chromium film 4a is selectively etched by RIE using the resist pattern 5 as an etching mask and $CCl_4$ as etching gas (FIG. 32), whereby a chromium pattern 4 is obtained. The resist pattern 5 is thereafter removed (FIG. 33).

Figure 33:
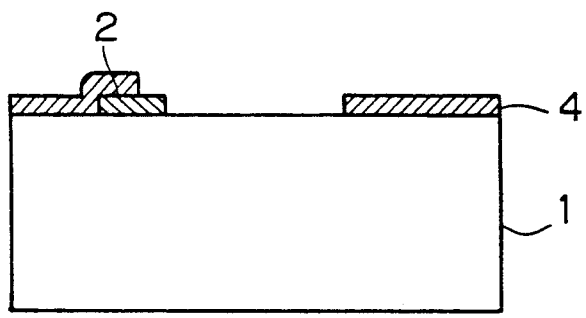
Figure 34:
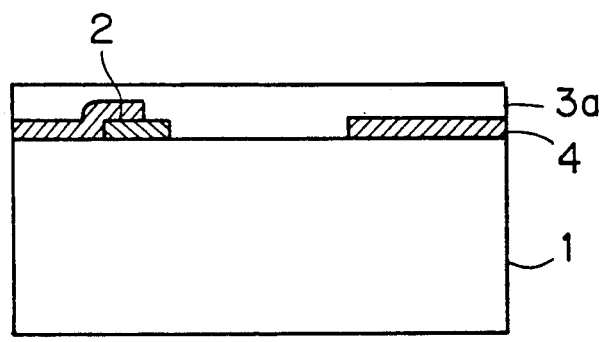
Figure 35:
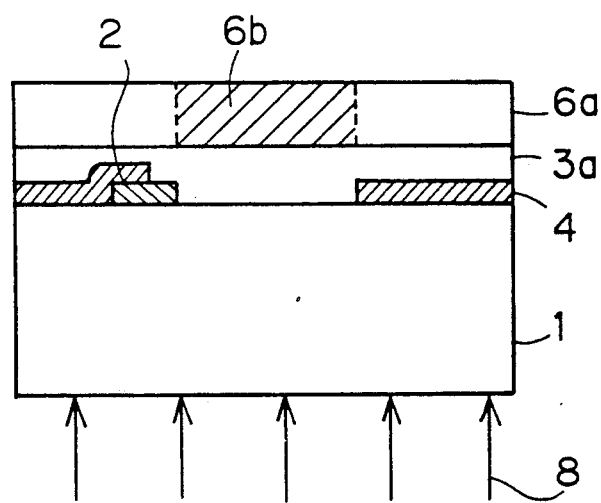

Next, an $SiO_2$ film 3a is grown by a conventional technique such as CVD on the phase-shifting mask of FIG. 33 (FIG. 34). The top surface of the $SiO_2$ film 3a is then coated with a UV-light sensitive negative resist film 6a using a spin coater (FIG. 35). The phase-shifting mask is illuminated with a UV light beam 8 from the bottom surface side of the substrate 1. As a result, the resist film 6a is exposed at a resist region 6b which corresponds to an aperture included in the chromium pattern 4 between the light-shielding pattern 2 and the chromium pattern 4.

Figure 36:
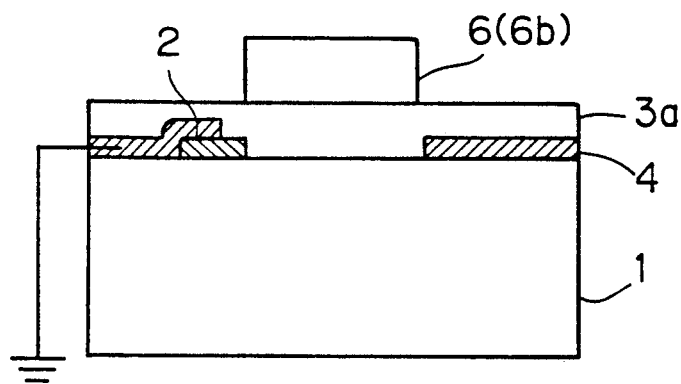
Figure 37:
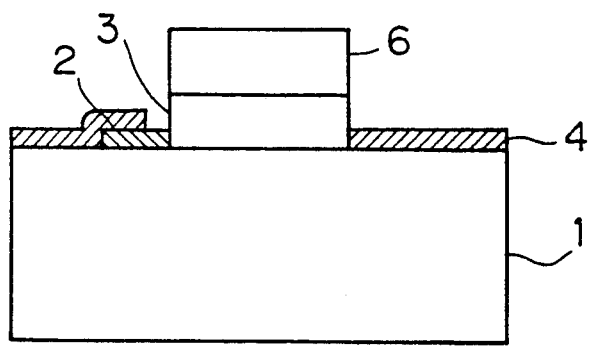
Figure 38:
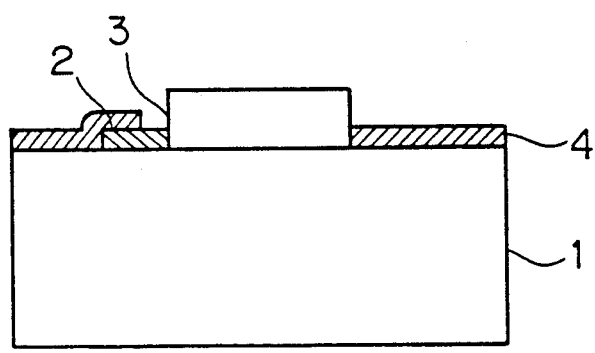

The resist film 6a is then developed, whereby the resist pattern 6 is defined (FIG. 36). The $SiO_2$ film 3a is thereafter selectively removed by RIE using the resist pattern 6 as an etching mask and $CHF_3$ as etching gas to obtain a phase-shifter 3 (FIG. 37). Like the previous embodiments, the chromium pattern 4 is grounded during the etching, preventing the substrate 1 from getting charged.

Figure 39:
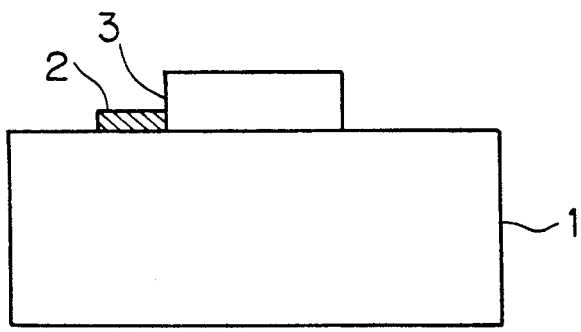

Next, the resist pattern 6 is removed by $O_2$ plasma ashing (FIG. 38), followed by removal of the chromium pattern 4 by RIE using $CCl_4$ as etching gas (FIG. 39). Thus, the phase-shifting mask which is approximately the same as the phase-shifting mask of the second preferred embodiment is manufactured.

It is readily seen that, in the third embodiment, the phase-shifter 3 and the light-shielding pattern 2 are aligned with inferior positional accuracy compared with the second preferred embodiment, the reason being that the phase-shifter 3 is not formed in a self-aligned manner. Instead, the manufacturing process steps of the third preferred embodiment are simpler than the second preferred embodiment.

A method of manufacturing a phase-shifting mask according to a fourth preferred embodiment of the present invention will be now described while referring to FIGS. 40-49. Like the second preferred embodiment, a light-shielding pattern 2' comprising non-transparent regions 2b and 2c and an aperture 2a defined by the non-transparent regions 2b and 2c is formed in advance, and the non-transparent region 2b is ultimately removed to obtain a desired light-shielding pattern 2.

Figure 40:
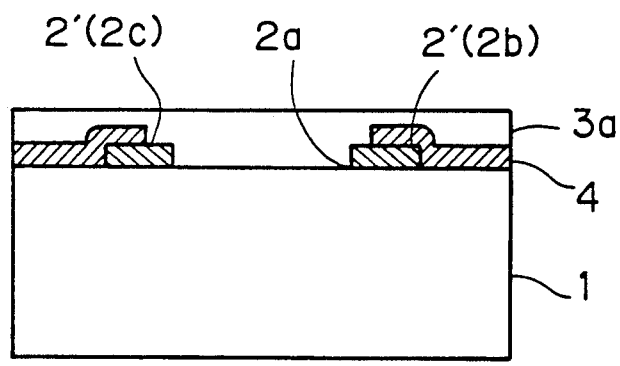
FIGS. 40-49 are diagrams showing a manufacturing method of a phase-shifting mask according to a fourth embodiment of the present invention.
Figure 41:
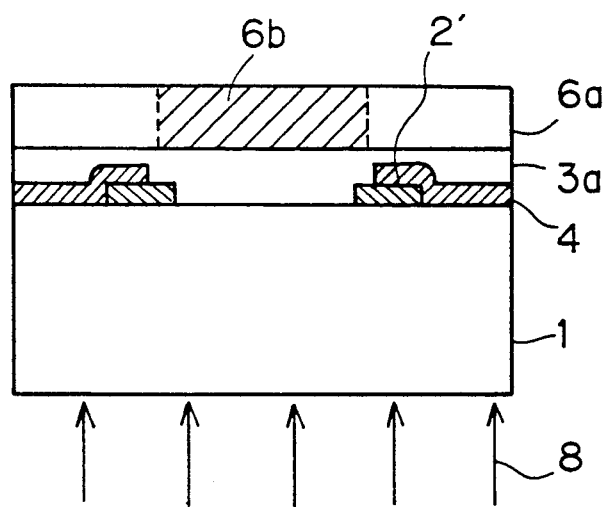
Figure 42:
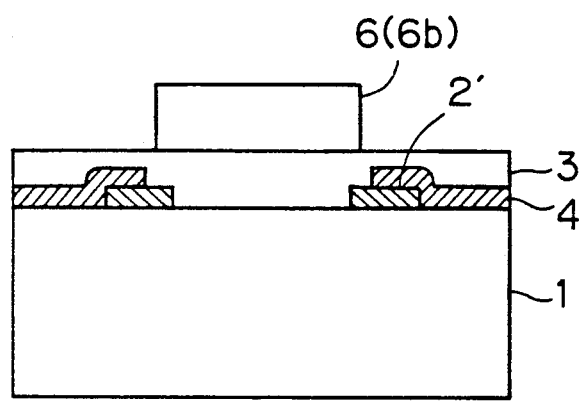

First, the light-shielding pattern 2', a chromium pattern 4 and an $SiO_2$ film 3a are formed in this order on a glass substrate 1 (FIG. 40). The $SiO_2$ film 3a is then spin coated with a UV-light sensitive negative resist film 6a (FIG. 41). Next, the resist film 6a is illuminated with a UV light beam 8 striking the substrate 1 from the bottom surface (FIG. 41). The irradiation dose must be larger than an optimum dose to allow for critical dimension loss, which is similar to the first preferred embodiment. Hence, a resist region 6b exposed with the UV light beam 8 becomes a little wider than the aperture 2a of the light-shielding pattern 2'.

Figure 43:
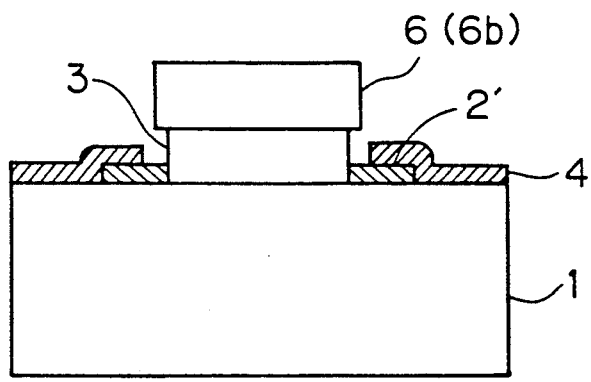
Figure 44:
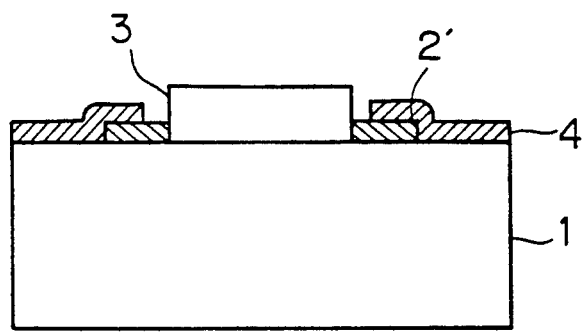

The resist film 6a is developed and dissolved to define a resist pattern 6 (FIG. 42), followed by selective etching of the $SiO_2$ film 3a using the resist pattern 6 as an etching mask. The selective etching at this stage differs from the corresponding etching of the previous embodiments in that vertical etch as well as lateral etch are needed. A resulting phase-shifter 3 corresponds to the aperture 2a of the light-shielding pattern 2' (FIG. 43).

Figure 45:
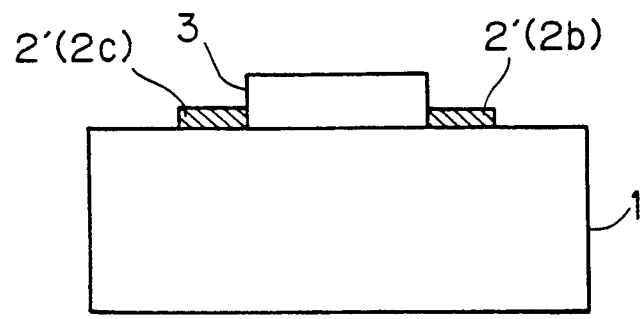
Figure 46:
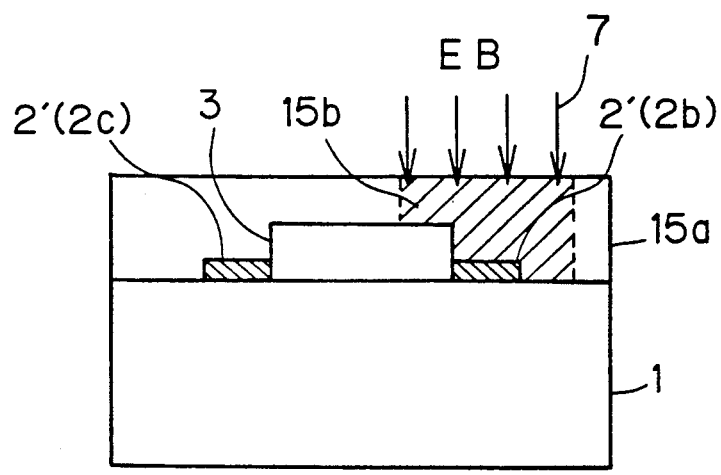
Figure 47:
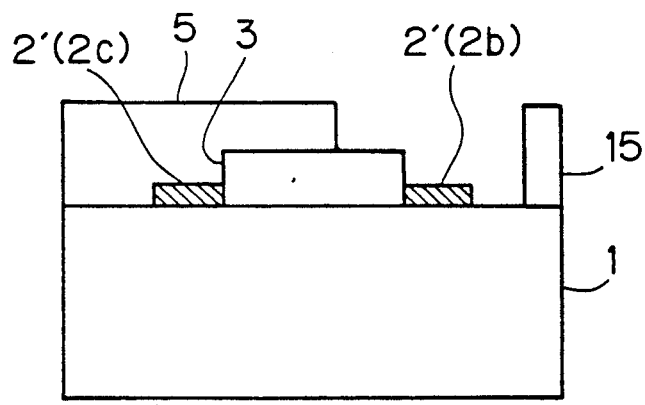
Figure 48:
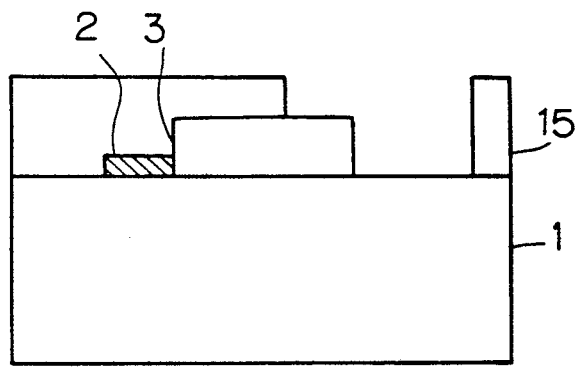
Figure 49:
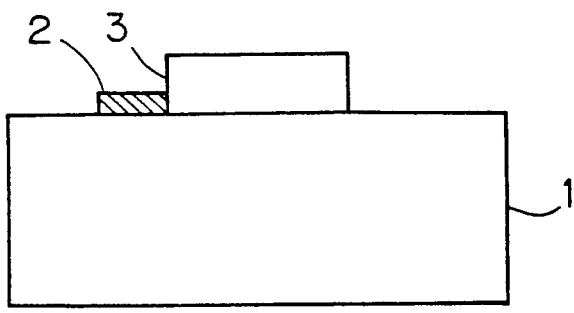

In a similar manner to the previous embodiments, the resist pattern 6 is then removed by $O_2$ plasma ashing (FIG. 44), and the chromium pattern 4 is etched by RIE, thereby obtaining the phase-shifting mask which is identical in structure to the phase-shifting mask of the second preferred embodiment (FIG. 45).

Figure 1A:
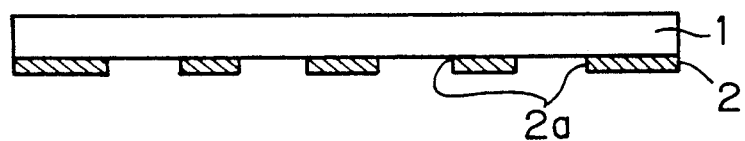
FIGS. 1A-1C are diagrams showing principles of lithography exposure using an ordinary photomask.
Figure 1B:
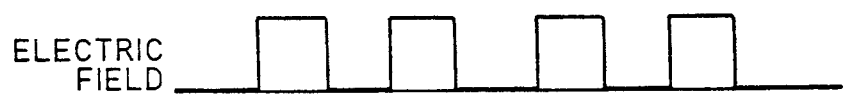
Figure 1C:
Figure 2A:
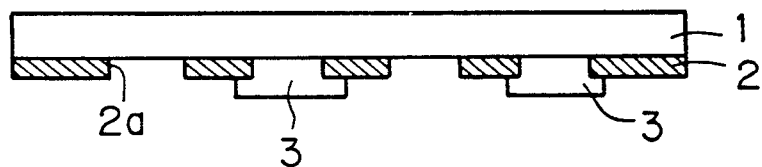
FIGS. 2A-2C are diagrams diagrams showing principles of a conventional phase-shifting mask.
Figure 2B:
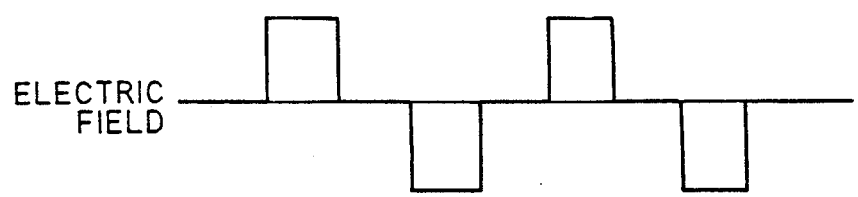
Figure 2C:
Figure 3A:
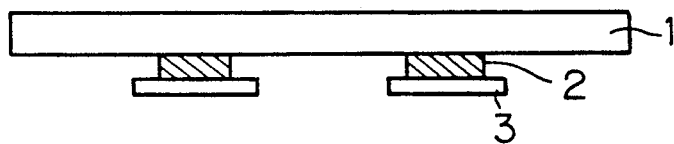
FIGS. 3A and 3B are diagrams showing principles of a conventional phase-shifting mask which ensures zero intensity at around a non-transparent region.
Figure 3B:
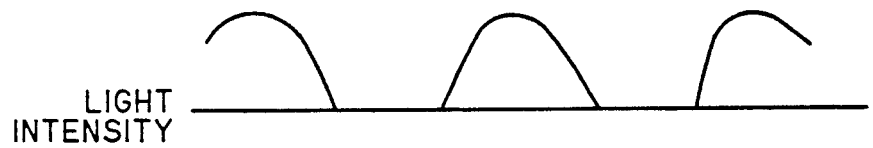
Figure 4A:
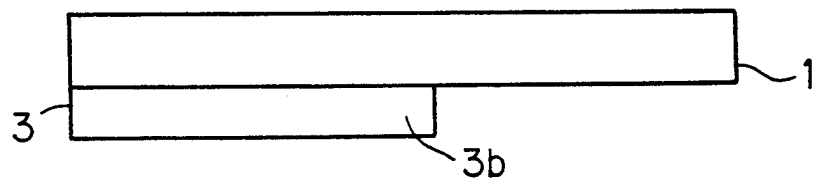
FIGS. 4A-4C are diagrams showing principles of a phase-shifting mask utilizing a sharp drop in intensity produced at an edge of a phase-shifter.
Figure 4B:
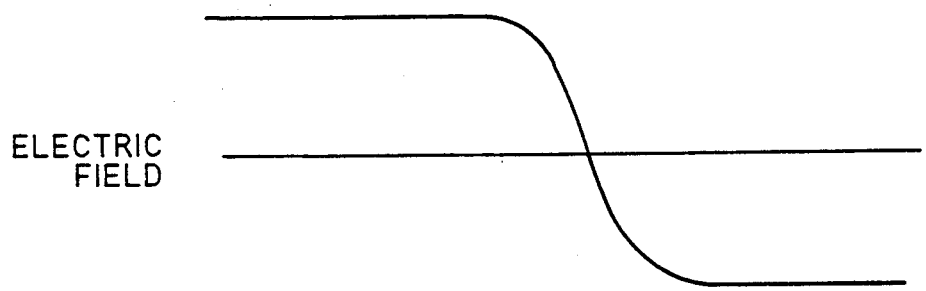
Figure 4C:
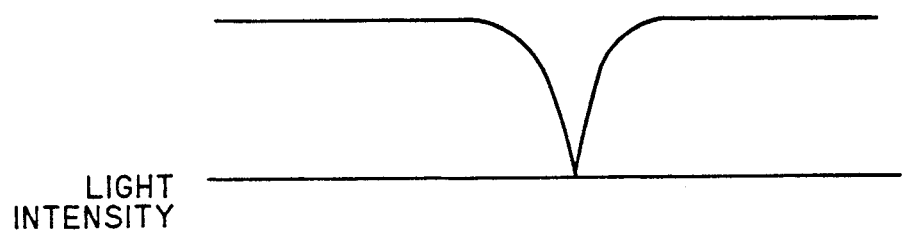

By removing the non-transparent region 2b so that the phase-shifting mask including the desired light-shielding pattern 2 and the phase-shifting pattern of FIG. 4A is obtained, the manufacturing process is completed. This step is the same as the corresponding step in the second preferred embodiment, and therefore, description of the same is simply omitted. Instead, it is appreciated that FIGS. 46-49 are referred to where the phase-shifting mask is shown with reference numbers and symbols which are identical or corresponding to those used in relation with the second preferred embodiment.

A method of manufacturing a phase-shifting mask according to a fifth preferred embodiment of the present invention will be described while referring to FIGS. 49-54.

Figure 50:
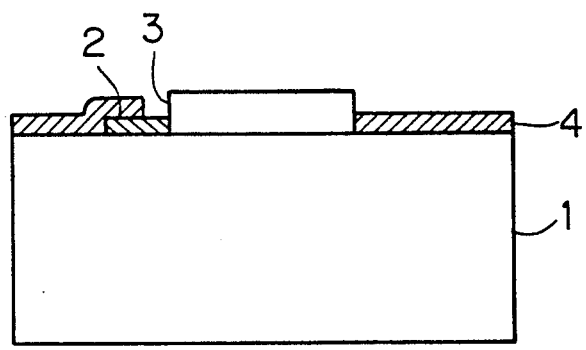
FIGS. 50-54 are diagrams showing a manufacturing method of a phase-shifting mask according to a fifth embodiment of the present invention.
Figure 51:
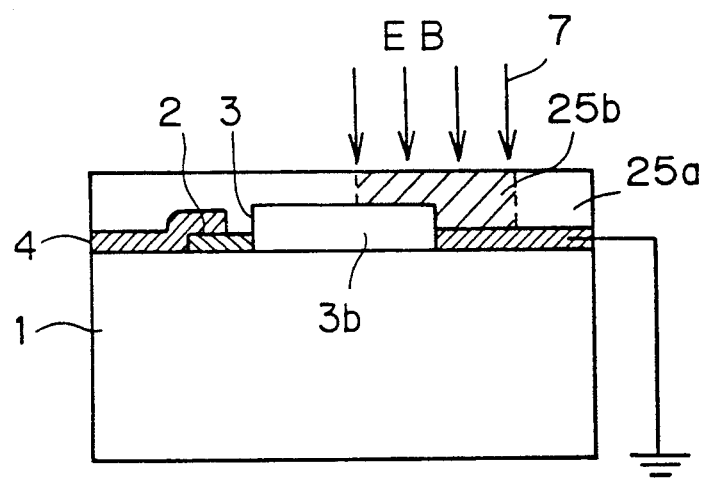

First, a light-shielding pattern 2 is formed on a glass substrate 1. Then, a chromium pattern 4 is deposited on the obtained substrate-pattern combination, and a phase-shifter 3 is formed (FIG. 50). This is similar in the third preferred embodiment, and hence, will not be described.

Figure 5A:
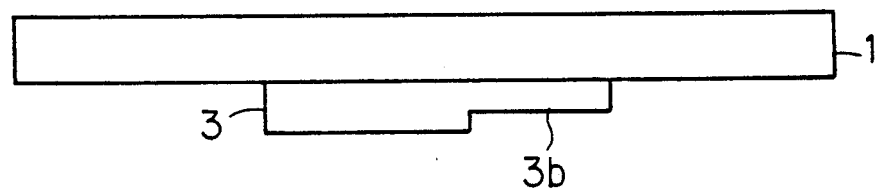
FIGS. 5A and 5B are diagrams showing principles of a phase-shifting mask partially eliminating a sharp drop in intensity produced at an edge of a phase-shifter.
Figure 5B:
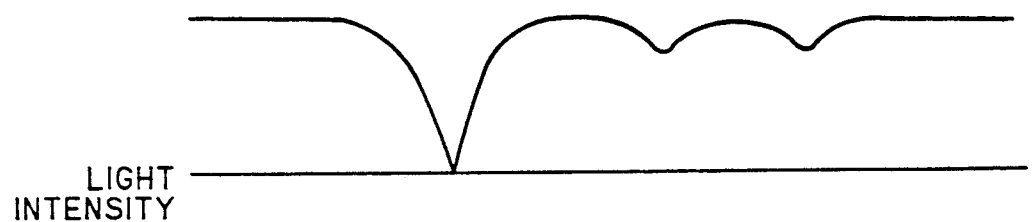

To obtain the phase-shifting pattern of FIG. 5A, the fifth preferred embodiment includes the following additional process steps (FIGS. 51-54). First, a positive resist film 25a which is sensitive to E-beam is coated over the light-shielding pattern 2, the chromium pattern 4 and the phase-shifter 3. The resist film 25a is then irradiated with an E-beam 7 in such a manner that a resist region 25b is exposed, the resist region 25b covering a portion to be removed 3b of the phase-shifter 3 and a portion of the chromium pattern 4.

Figure 52:
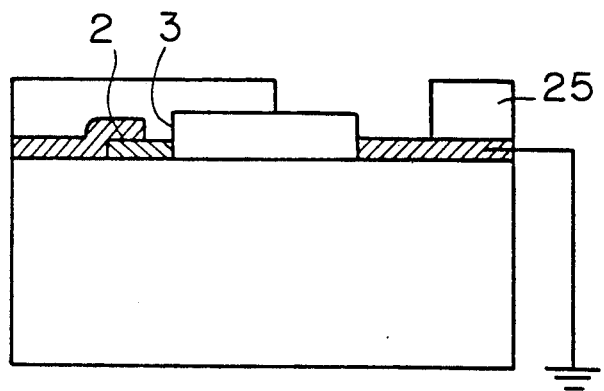
Figure 53:
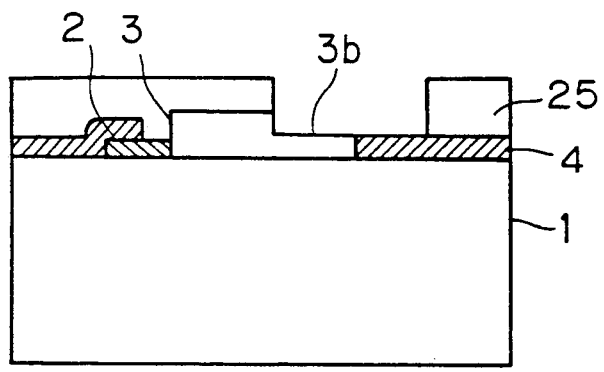
Figure 54:
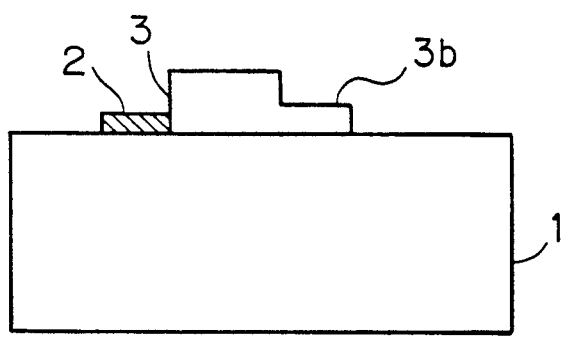

The resist region 25b is then developed and dissolved, defining a resist pattern 25 (FIG. 52). Following this, the portion 3b of the phase-shifter is removed by RIE using the resist pattern 25 as an etching mask and $CHF_3$ as etching gas, whereby the thickness of the portion 3b is reduced by about half (FIG. 53). During the etching, the chromium pattern 4 covering the substrate 1 acts as a protection film of the substrate 1. As a result, etching of the substrate 1 does not occur. By thereafter removing the resist pattern 25 and the chromium pattern 4 in this order, the phase-shifting mask of the FIG. 54 is obtained.

Although it has been described that the first to the fifth preferred embodiments require that the light-shielding pattern 2 is made of molybdenum and the conductive pattern 4 acting as an etching stopper or a protection film is made of chromium, this combination is not limiting in any respect. For instance, other material such as chromium is a good candidate for the light-shielding pattern 2. So molybdenum silicide is for the conductive pattern 4. Any other conbination is possible as long as the patterns 2 and 4 both prohibit light transmission and the one (e.g., chromium) would be scarcely etched during etching of the other (e.g., molybdenum silicide).

The foregoing description of the preferred embodiments of the present invention have been presented for the purpose of illustration and description. It is not intended to be restricting or to limit the present invention to the exact forms disclosed heretofore, and many other modifications and variations are possible within the scope of the present invention.

I claim:

1. A method of manufacturing a phase-shifting photomask comprising a transparent substrate, a light-shielding pattern and a phase-shifter, said transparent substrate having a first major surface and a second major surface, said light-shielding pattern and said phase-shifter being provided on said first major surface of said transparent substrate, said method comprising the steps of:
   (a) preparing said transparent substrate;
   (b) forming said light-shielding pattern on said first major surface of said transparent substrate;
   (c) covering said first major surface of said transparent substrate and said light-shielding pattern with a conductive film made of metal or silicide metal;
   (d) removing said conductive film at a selected portion in which said phase-shifter is to be formed, thereby defining a conductive pattern;
   (e) depositing a phase-shifting film on said transparent substrate, said light-shielding pattern and said conductive pattern;
   (f) selectively etching and removing said phase-shifting film except at said selection portion, thereby said phase-shifter being obtained; and
   (g) removing said conductive pattern.

2. A method of claim 1, wherein said step (d) comprises the steps of:
   (d-1) coating said conductive film with a resist film;
   (d-2) exposing said resist film at a selected portion by electron-beam irradiation;
   (d-3) developing said resist film and etching said selected portion of said resist film, thereby forming a resist pattern; and
   (d-4) selectively etching said conductive film with said resist pattern as an etching mask.

3. A method of claim 2, wherein said conductive film is grounded during said E-beam irradiation.

4. A method of claim 2, wherein said conductive film is chromium.

5. A method of claim 4, wherein said conductive film is selectively etched by reactive ion etching using CCl$_4$ as the etching gas.

6. A method of claim 1 further comprising the steps of:
   (h) depositing a resist film on said light-shielding pattern, said phase-shifter and said conductive pattern;
   (i) etching said resist film at a selected portion over one end portion of said phase-shifter and a portion of said conductive pattern adjacent to said one end portion and defining a resist pattern; and
   (j) thinning said one end portion of said phase-shifter to a predetermined thickness by etching using said resist pattern as an etching mask.

7. A method of claim 6, wherein said step (h) comprises the steps of:
   (h-1) exposing said selected portion of said resist film by E-beam irradiation; and
   (h-2) developing said resist film and etching said selected portion thereof.

8. A method of claim 7, wherein said conductive pattern is grounded during the E-beam irradiation of said selected portion of said resist film.

9. A method of claim 6, wherein said phase-shifter is made of SiO$_2$.

10. A method of claim 9, wherein said phase-shifter is selectively etched by reactive ion etching using CHF$_3$ as the etching gas.

11. A method of claim 1, wherein a pattern defect inspection step is carried out before said step (e) to inspect a pattern defect in said conductive pattern if any.

12. A method of claim 11 further comprising the step of repairing said pattern defect in said conductive pattern inspected in said pattern defect inspection step.

13. A method of manufacturing a phase-shifting photomask comprising a transparent substrate, a first light-shielding pattern and a phase-shifter, said transparent substrate having a first major surface and a second major surface, said first light-shielding pattern and said phase-shifter abutting each other on said first major surface of said transparent substrate, said method comprising the steps of:
   (a) preparing said transparent substrate;
   (b) forming a second light-shielding pattern which includes said first light-shielding pattern on said first major surface of said transparent substrate, said second light-shielding pattern comprising non-transparent regions and an aperture between said non-transparent regions;
   (c) depositing a phase-shifting film on said transparent substrate and said second light-shielding pattern;
   (d) coating said phase-shifting material with resist film;
   (e) irradiating a light beam toward said second major surface of said transparent substrate and exposing said resist film at a selected portion;
   (f) developing said resist film, thereby obtaining a resist pattern which corresponds to said selected portion of said resist film;
   (g) selectively etching said phase-shifting film with said resist pattern as an etching mask to obtain said phase-shifter; and
   (h) removing said at least one of said non-transparent regions, thereby obtaining said first light-shielding pattern.

14. A method of claim 13, wherein said phase-shifter is made of SiO$_2$.

15. A method of claim 14, wherein said phase-shifting material is selectively etched by reactive ion etching using CHF$_3$ as the etching gas.

16. A method of claim 13, wherein said step (h) comprises the steps of:
   (h-1) forming a resist film over said transparent substrate, said phase-shifter and said second light-shielding pattern;
   (h-2) exposing with E-beam said resist film at a predetermined portion which includes at least one of said non-transparent regions which must be removed;

(h-3) developing said resist film and etching said predetermined portion of said resist film, thereby defining a resist pattern; and (h-4) removing said at least one of said non-transparent regions which must be removed by etching using said resist pattern as an etching mask.

17. A method of claim 16, wherein said non-transparent regions are made of molybdenum silicide.

18. A method of claim 17, wherein said at least one of said non-transparent regions is removed by reactive ion etching using $CF_4$ as the etching gas.

19. A method of manufacturing a phase-shifting mask, comprising the steps of:

(a) preparing a transparent substrate having a first major surface and a second major surface;

(b) forming a light-shielding pattern on said first major surface of said transparent substrate, said light-shielding pattern including non-transparent regions and a predetermined aperture between said non-transparent regions, (c) forming a conductive film made of metal or silicide metal on said transparent substrate and said light-shielding pattern;

(d) patterning said conductive film at a portion corresponding to said aperture by E-beam lithography removal thereby defining a conductive pattern;

(e) depositing a phase-shielding film on said transparent substrate, said light-shielding pattern and said conductive pattern;

(f) coating said phase-shifting film with a resist film;

(g) irradiating a light beam toward said second major surface of said transparent substrate and exposing said resist film at portion corresponding to said aperture;

(h) developing said resist film and obtaining a resist pattern corresponding to said aperture; and (i) selectively etching said phase-shifting film with said resist pattern as an etching mask thereby forming a phase-shifter.

* * * * *